(12) United States Patent
Choudhary et al.

(10) Patent No.: US 10,141,749 B2
(45) Date of Patent: Nov. 27, 2018

(54) RESONANCE TUNING

(71) Applicant: National Semiconductor Corporation, Santa Clara, CA (US)

(72) Inventors: Vijay N. Choudhary, Chandler, AZ (US); Robert Loke, Sunnyvale, CA (US)

(73) Assignee: NATIONAL SEMICONDUCTOR CORPORATION, Santa Clara, CA (US)

( * ) Notice: Subject to any disclaimer, the term of this patent is extended or adjusted under 35 U.S.C. 154(b) by 0 days.

(21) Appl. No.: 14/954,501

(22) Filed: Nov. 30, 2015

(65) Prior Publication Data

US 2016/0141889 A1  May 19, 2016

Related U.S. Application Data

(63) Continuation of application No. 13/117,186, filed on May 27, 2011, now Pat. No. 9,203,380.

(60) Provisional application No. 61/428,070, filed on Dec. 29, 2010.

(51) Int. Cl.
*H02J 5/00* (2016.01)
*H03J 1/00* (2006.01)

(52) U.S. Cl.
CPC ............ *H02J 5/005* (2013.01); *H03J 1/0091* (2013.01)

(58) Field of Classification Search
CPC . H02J 5/005; H02J 50/00; H02J 17/00; H01F 38/14
USPC .......................................................... 307/104
See application file for complete search history.

(56) References Cited

U.S. PATENT DOCUMENTS

| | | |
|---|---|---|
| 7,741,734 B2 | 6/2010 | Joannopoulos et al. |
| 8,791,601 B2 | 7/2014 | Furukawa |
| 2009/0009007 A1* | 1/2009 | Kato .................. G06K 19/0701 307/104 |

(Continued)

OTHER PUBLICATIONS

Hideaki Abe, et al., "A Noncontact Charger Using a Resonant Converter with Parallel Capacitor of the Secondary Coil", 2000 IEEE Xplore.

(Continued)

*Primary Examiner* — Daniel Kessie
(74) *Attorney, Agent, or Firm* — Andy Viger; Charles A. Brill; Frank D. Cimino

(57) ABSTRACT

One heuristic for tuning a wireless power transfer device includes monitoring a circuit parameter while sweeping a power source frequency; identifying two frequencies related to local maxima of the circuit parameter values; estimating self-resonant frequency of an electromagnetically coupled device based on the two frequencies; determining a value for a tuning component of the wireless power transfer device such that the device self-resonant frequency equals the estimated coupled device self-resonant frequency; and adjusting the tuning component to the determined value.

Another tuning heuristic includes monitoring a circuit parameter while sweeping the power source frequency; identifying two frequencies related to two local maximum for the values of the circuit parameter; determining a desired resonance frequency for the wireless power transfer device based on stored information; and adjusting the tuning component to a value that causes the wireless power transfer device when uncoupled to operate at or near the desired resonance frequency.

10 Claims, 7 Drawing Sheets

(56) References Cited

U.S. PATENT DOCUMENTS

| | | | | |
|---|---|---|---|---|
| 2010/0244577 A1* | 9/2010 | Shimokawa | ............ | B60L 11/182 307/104 |
| 2011/0227421 A1* | 9/2011 | Sakoda | ................ | B60L 11/182 307/104 |
| 2011/0316348 A1* | 12/2011 | Kai | ......................... | H02J 50/40 307/104 |
| 2012/0013198 A1* | 1/2012 | Uramoto | ................ | H02J 5/005 307/104 |

OTHER PUBLICATIONS

Chwei-Sen Wang, et al.; "Power Transfer Capability and Bifurcation Phenomena of Loosely Coupled Inductive Power Transfer Systems", 2004 IEEE Xplore.

R. Laouamer, et al.; "A Multi-Resonant Converter for Non-Contact Charging with Electromagnetic Coupling", Jul. 22, 2010 IEEE Xplore.

Andre Kurs, et al.; "Wireless Power Transfer via Strongly Coupled Magnetic Resonances", Science Express, Jun. 2007.

Yuequan Hu, et al.; "Universal-Input Single-Stage PFC Flyback with Variable Boost Inductance for High-Brightness LED Applications", IEEE 2010.

G. Vandevoorde, et al.; "Wireless energy transfer for stand-alone systems: a comparison between low and high power applicability", Published by Elsevier Science B.V. 2001.

Xiao Zhi Jian, et al.; "A Novel Wireless Charging System for Movable Telephone with Printed-circuit-board Windings of Different Structure and Shape Respectively", International Conference on Electrical Machines and Systems 2007, Oct. 8-11, Seoul, Korea.

Jun Pan, et al.; "A Self-Powered Sensor Module Using Vibration-Based Energy Generation for Ubiquitous Systems", IEEE 2005.

Geffrey K. Ottman, et al.; "Adaptive Piezoelectric Energy Harvesting Circuit for Wireless Remote Power Supply", IEEE 2002.

C. C., Tsai B., et al.; "Design Wireless Transcutaneous Energy Transmission System for Totally Artificial Hearts", IEEE 2000.

David L. Mascarenas, et al.; "Experimental studies of using wireless energy transmission for powering embedded sendor nodes", Journal of Sound and Vibration, Published by Elsevier Ltd. 2009.

Jonsensor Zhao; "A new calculation for designing multilayer planar spiral inductors", EDN Jul. 29, 2010.

Takehiro Imura, et al.; "Basic Experimental Study on Helical Antennas of Wireless Power Transfer for Electric Vehicles by Using Magnetic Resonant Coupling", IEEE 2009.

Aristeidis Karalis, et al.; "Efficient wireless non-radiative mid-range energy transfer", Elsevier, Science Direct, Annals of Physics 2007.

* cited by examiner

RESONANCE TUNING

CROSS REFERENCE TO RELATED APPLICATIONS

The present application claims benefit to U.S. provisional application 61/428,070 filed Dec. 29, 2010 entitled RESONANCE TUNING, the contents of which is incorporated herein in its entirety.

BACKGROUND

In a wireless power transfer system, the amount of power and the efficiency of the power transfer are affected by many factors. As a few of many examples, distance between power transfer coils, orientation of coils, and number and type of objects in the vicinity all affect power transfer. As coupling between the coils decreases, from the above illustrative factors or other factors, power transfer tends to decrease.

Power transfer is increased when both the transmitter and receiver in a wireless power transfer system are operating at the same resonance frequency. In some systems, the resonance frequency of one or both of the transmitter and receiver may be tuned by adjusting a circuit parameter.

It is desirable to have the capability to tune the transmitter based solely on information measured or retrieved from within the transmitter, or to tune the receiver based solely on information measured or retrieved from within the receiver.

FIGURES

DETAILED DESCRIPTION

Described below are exemplary heuristics for tuning of dual series resonance circuits coupled for wireless power transfer and having a low coefficient of coupling. A first heuristic provides fast tuning based on reiteratively tuning the self-resonant frequency of the primary to approach the self-resonant frequency of the secondary. A second heuristic provides single-pass tuning for the self-resonant frequency of the primary to the self-resonant frequency of the secondary.

Figure 1:
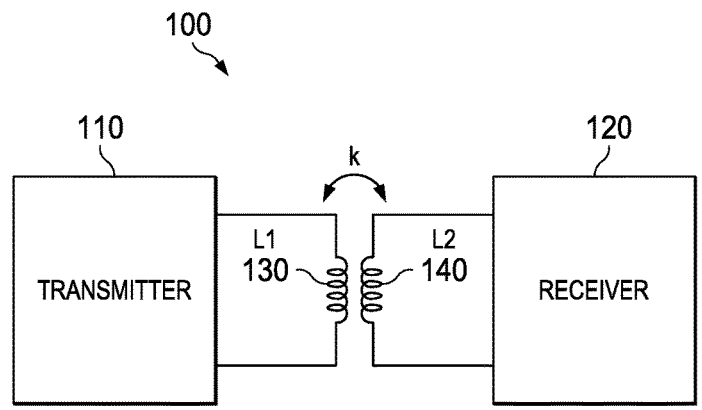
FIG. 1 illustrates an exemplary wireless power transfer system model.

FIG. 1 illustrates an exemplary wireless power transfer system 100. A transmitter 110 transfers power to a receiver 120 through a power transfer from transmitter coil 130 having inductance L1 to receiver coil 140 having inductance L2. Coils 130 and 140 are coupled with a coefficient of coupling k.

Transmitter 110 may be a stationary or a portable device, and may be configured to provide power to multiple receivers 120.

Receiver 120 may be a stationary or a portable device. Receiver 120 may be implemented within a handheld device such as smart phone or personal digital assistant, or within a computing device such as a tablet or laptop computer or a reading device. Further, receiver 120 may be implemented within household use devices or industry use devices. For example, receiver 120 may be included within a hearing aid or a toothbrush, or may be included within rechargeable tools or automated factory transport devices.

In some implementations both transmitter 110 and receiver 120 are implemented as stationary devices wherein wireless power transfer provides for powering of receiver 120 while maintaining physical isolation between transmitter 110 and receiver 120.

Coil 130 and coil 140 each may be formed in one or more layers, in one or more of a variety of geometries, and in one or more of a variety of materials. Further, each of coil 130 and coil 140 may be a combination of two or more coils electrically connected. Although coils 130 and 140 are illustrated in FIG. 1 as being external to transmitter 110 and receiver 120, respectively, coils 130 and 140 may alternatively be internal or may be a combination of internal and external. The terms internal and external in this context are in relation to the associated housing.

Figure 2:
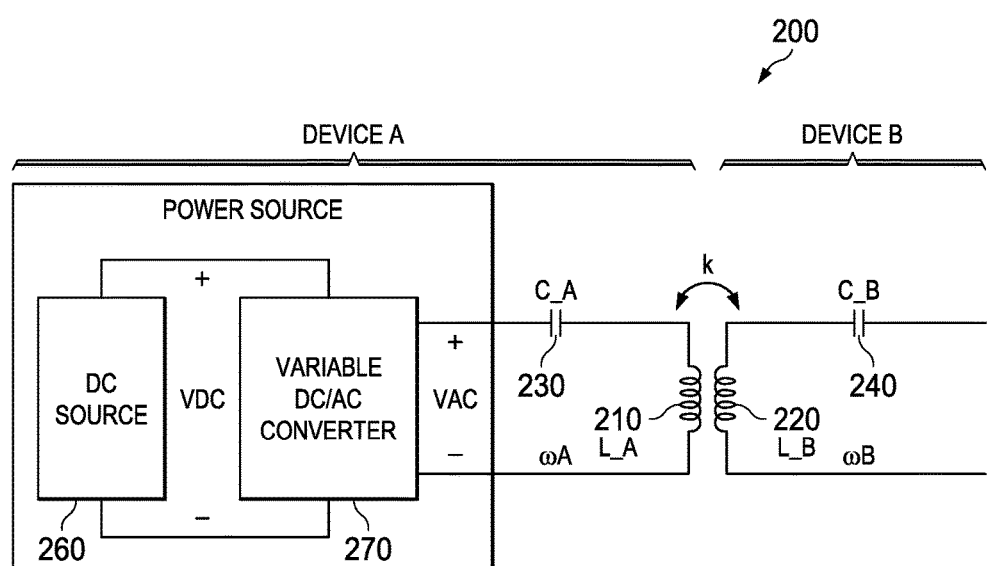
FIG. 2 illustrates another exemplary wireless power transfer system model.

FIG. 2 illustrates an exemplary wireless power transfer system 200 including a device A with coil 210 having inductance L_A and a device B with coil 220 having inductance L_B. One of device A and device B is a transmitter and the other of device A and device B is a receiver. Power transfers between coils 210 and 220.

Device A includes a capacitor 230 having capacitance C_A. Coil 210 and capacitor 230 together form or are part of a resonant circuit with self-resonant frequency ωA. Device B includes a capacitor 240 having capacitance C_B. Coil 220 and capacitor 240 together form or are part of a resonant circuit with self-resonant frequency ωB.

Device A further includes a power source 250 including a direct current (DC) source 260 with output voltage Vdc that is converted to an alternating current (AC) voltage Vac by a variable DC/AC converter 270. The frequency of DC/AC converter 270 output Vac is variable and may be controlled. For example, if DC/AC converter 270 is implemented with a set of switches, the frequency or duration of the switch control signals may be adjusted to change the frequency of voltage Vac.

Devices A and B may include additional components, not shown. Further, other topologies may be implemented. For example, although devices A and B are illustrated with series resonant circuits wherein a capacitor is in series with the power transfer coil, alternative topologies include parallel-series resonant and series-parallel resonant circuit implementations using multiple capacitors in series with and parallel to the power transfer coil. However, for ease of understanding, the exemplary series resonant circuits are illustrated and used as a basis for the following discussion and equations.

Transfer of power between two self-resonant devices such as devices A and B in FIG. 2 occurs when the self-resonant frequencies of the two devices are nearly equal. For example, for devices A and B in FIG. 2, transfer of power occurs when ωA is approximately equal to ωB. For a series-resonant circuit, the self-resonant frequency co is defined as function of the inductance of the coil and the capacitance of the series capacitor.

$$\omega = \frac{1}{\sqrt{LC}} \quad (1)$$

When coupling occurs between the coils of two resonant circuits the coils influence each other resulting in a splitting of the resonant frequencies into resonant modes (i.e., mode splitting). The resonant modes, or Eigen-frequencies $\omega i$, may be determined from equation 3 for a system such as the system 200 illustrated in FIG. 2.

$$\omega i = \sqrt{\frac{\omega A^2 + \omega B^2 \pm \sqrt{(\omega A^2 - \omega B^2)^2 + 4\omega A^2 \omega B^2 k^2}}{2(1-k^2)}} \quad (2)$$

Setting $\omega A=\omega B=\omega 0$ in equation 2 results in the relationship shown in equation 3.

$$\omega = \frac{\omega 0}{\sqrt{1 \pm k}} \quad (3)$$

From equation 3 it can be seen that for non-zero coupling coefficient k, mode splitting happens even with perfectly tuned coils. For small k, equation 3 may be approximated as shown in equation 4.

$$\omega \approx \omega 0 \left(1 \pm \frac{k}{2}\right) \quad (4)$$

The distance $\Delta\omega$ between the resonant modes is thus approximately as shown in equation 5 for two resonant circuits tuned to the same resonant frequency and with small coupling coefficient k. The resonant modes are centered at $\omega 0$.

$$\Delta\omega \approx k*\omega 0 \quad (5)$$

Returning to equation 2, it can be seen that for very small values of coupling coefficient k, the resonant modes are approximately equal to the self-resonant frequencies of the two resonant circuits, as shown in equations 6-8.

$$\omega i \approx \sqrt{\frac{\omega A^2 + \omega B^2 \pm \sqrt{(\omega A^2 - \omega B^2)^2 + 0}}{2(1-0)}} \quad (6)$$

$$\omega i \approx \sqrt{\frac{\omega A^2 + \omega B^2 \pm (\omega A^2 - \omega B)^2}{2}} \quad (7)$$

$$\omega i \approx \omega A, \omega B \quad (8)$$

The relationships given by equations 1-8 were confirmed by both simulation and measurement of a coupled system substantially represented by system 200 of FIG. 2. For the system and for the simulation the values L_A=100 μH, L_B=100 μH, and C_B=2.903 nF were kept constant while the value C_A was varied. Coupling coefficient k was 0.08. The results are of the simulations and measurements are provided in Table 1, where frequency f relates to co according to the equation $\omega=2\pi f$.

TABLE 1

| k = 0.08 | | Simulation | | Measurement | |
|---|---|---|---|---|---|
| Trial | C_A (nF) | fA (kHz) | fB (kHz) | fA (kHz) | fB (kHz) |
| 1 | 2.50 | 290.4 | 324.4 | 291.2 | 324.3 |
| 2 | 2.60 | 289.4 | 319.2 | 288.9 | 319.2 |
| 3 | 2.70 | 288.1 | 314.7 | 287.8 | 314.7 |
| 4 | 2.80 | 286.3 | 310.9 | 287.0 | 310.8 |
| 5 | 2.90 | 284.1 | 307.9 | 284.7 | 307.6 |
| 6 | 3.00 | 281.7 | 305.7 | 281.9 | 305.2 |
| 7 | 3.10 | 278.7 | 303.9 | 278.9 | 303.5 |
| 8 | 3.20 | 275.5 | 302.6 | 275.6 | 302.2 |
| 9 | 3.30 | 272.2 | 301.6 | 272.3 | 301.2 |

As described above, the relationship $\Delta\omega \approx k*\omega 0$ of equation 5 provides the theoretical distance between the resonant modes when both devices are operating at the same self-resonant frequency. In Table 1, the self-resonant frequency of device B is calculated using equation 1 and the relationship $\omega=2\pi f$ as 295.4 kHz. Multiplying 295.4 kHz by k=0.08 results in a theoretical distance of 23.6 kHz between the resonant modes. Device A self-resonant frequency is substantially equal to device B self-resonant frequency for C_A=2.9 nF, thus the distance between the resonant modes should be approximately 23.6 kHz. Table 1 provides a simulation distance of 23.8 kHz and a measured distance of 22.9 kHz for trial 5. The example calculation provided in this paragraph illustrates that equations 1-8 may be used to approximate a system such as system 200 in FIG. 2.

In equation 8 it is shown that when the coefficient of coupling is very low, the resonant modes are approximately equal to the self-resonant frequencies of the two circuits. As the self-resonant frequencies of the two circuits are tuned such that the self-resonant frequencies approach the point where they are substantially equally, resonant modes tend to coincide and may not be separable.

Figure 3:
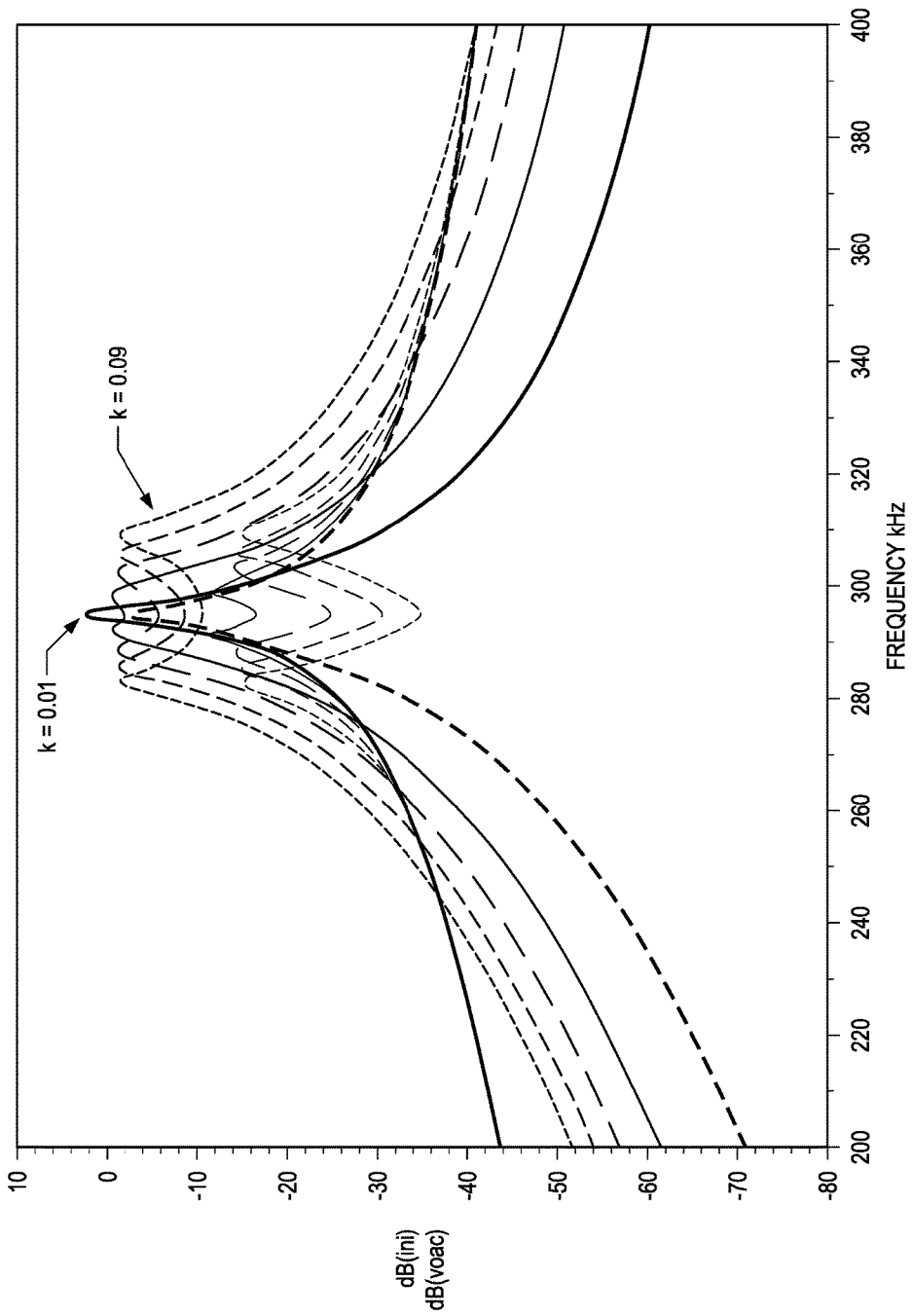
FIG. 3 illustrates exemplary simulation results for an exemplary wireless power transfer system model.

FIG. 3 provides the results of a simulation of a system similar to the system 200 illustrated in FIG. 2 with matching self-resonant frequencies of approximately 295 kHz. For the simulation, the coupling coefficient was varied from a relatively small value of k=0.09 to a very small value of k=0.01. As can be seen by the results presented in FIG. 3, as k increases the distance between the resonant modes increases, and as k decreases to a very small value, the resonant modes combine to a single resonant mode at the matching self-resonant frequency of the two resonant circuits.

Figure 4:
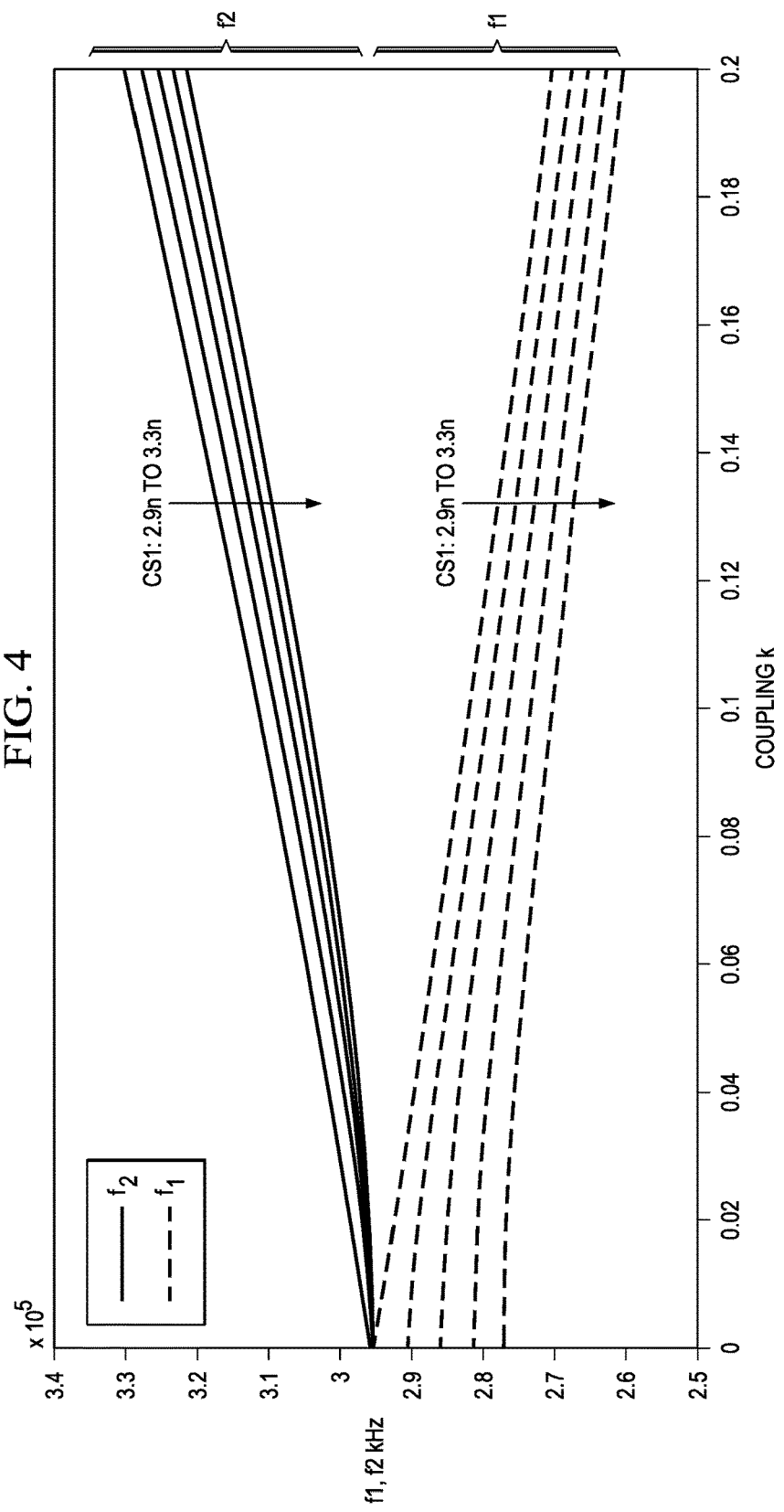
FIG. 4 illustrates further exemplary simulation results for an exemplary wireless power transfer system model.

FIG. 4 provides the results of a further simulation of a system similar to the system 200 illustrated in FIG. 2. The simulation results presented in FIG. 4 illustrate the relationship described by equation 2 between the resonant modes of the system, the self-resonant frequencies of the circuits, and the coupling coefficient k. When the circuits are not tuned to same self-resonant frequency, the resonant modes will be farther apart. Simulation results are presented for capacitance C_A of device A (referred to in FIG. 4 as CS1) for capacitance values 2.9 nF to 3.3 nF. For the simulation the values L_A=L_B=100 uH, and C_B=2.9 nF were kept constant.

From the above discussions it can be seen that it is desirable to have the capability to tune one of the resonant circuits in a coupled system such that the self-resonant frequency of the one circuit is substantially equal to the self-resonant frequency of the other circuit for improved wireless power transfer. Three exemplary heuristics 500, 600, and 800 are provided below for achieving matched tuning between two resonant circuits. Heuristics 500 and 600 are iterative heuristics, whereas heuristic 800 is a single-pass heuristic.

Figure 5:
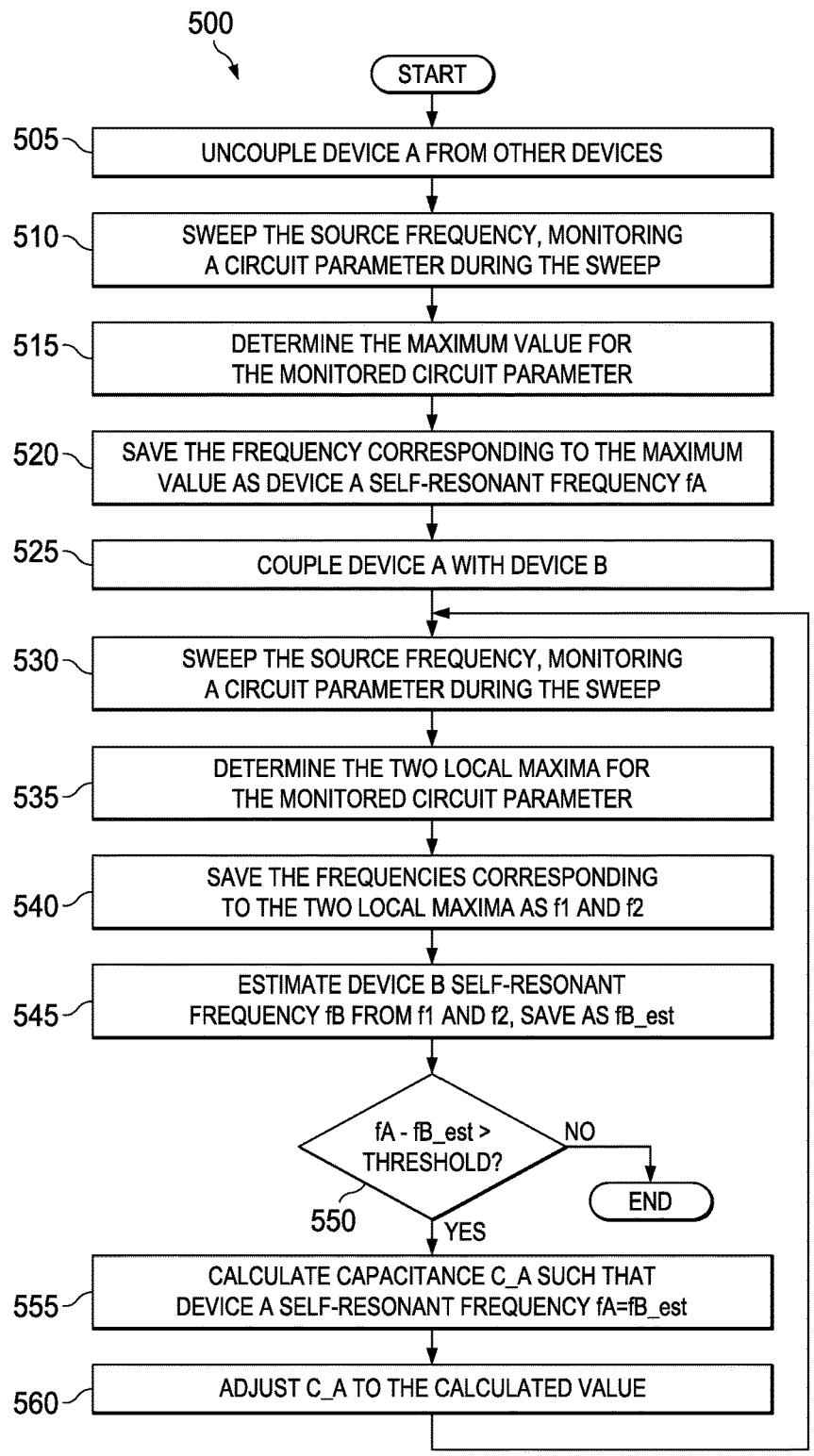
FIG. 5 illustrates an exemplary heuristic for tuning a device to achieve improved power transfer.

FIG. 5 illustrates a first exemplary heuristic for tuning a device A to achieve improved power transfer between the device A and a device B.

Heuristic 500 in FIG. 5 starts with optional blocks 505-520 in which the self-resonant frequency fA of device A is determined. In block 505, device A is uncoupled from all other devices. Uncoupling in this context refers to physically removing or otherwise isolating device A from the influence of any other device that could electromagnetically couple to the power transfer coil of device A.

In block 510, the source frequency of device A is swept and a circuit parameter monitored, wherein the frequency of the source is stepped from a starting frequency to an ending frequency in discrete steps and at each frequency step the value of a circuit parameter is measured. For example, the input current may be measured at each frequency step. Other circuit parameters that could be monitored include but are not limited to voltage across the coil of device A, or power delivered by the source.

In block 515, the data from the monitored circuit parameter is analyzed to determine a maximum value for the parameter.

In block 520, the frequency corresponding to the maximum value of the monitored circuit parameter is saved as the self-resonant frequency fA of device A.

In block 525, tuning of device A to device B begins by coupling device A and device B. Coupling in this context refers to physically placing device B in the vicinity of device A, or removing an isolation mechanism from device A. Coupling requires both device A and device B to be powered and the corresponding resonant circuits to be active.

In block 530, the source frequency of device A is swept and a circuit parameter monitored, wherein the frequency of the source is stepped from a starting frequency to an ending frequency in discrete steps and at each frequency step the value of a circuit parameter is measured. The frequency steps of block 530 are not necessarily the same frequency steps and do not necessarily have the same frequency delta between the steps as do the steps of block 510. The monitored circuit parameter may be the same as the parameter monitored in block 515 but may alternatively be a different parameter or set of parameters. Circuit parameters that could be monitored include but are not limited to source current of device A, voltage across the coil of device A, power delivered by the source of device A, efficiency of power delivery, voltage across the coil of device B, coil current of device B, output voltage of device B, and output power of device B.

In block 535, the data from the monitored circuit parameter is analyzed to determine the two local maxima for the monitored parameter corresponding to the two resonant modes of the coupled devices.

In block 540, the two frequencies corresponding to the two local maxima of the circuit parameter are saved as frequencies f1 and f2.

In block 545, the self-resonant frequency fB of device B is estimated from frequencies f1 and f2 and saved as fB_est. There are many ways of estimating fB from f1 and f2, including using equation 9.

$$fB\_est = m*f1 + n*f2 \qquad (9)$$

In a simple instance of an estimation using equation 9, variables m and n are set to $m = n = \frac{1}{2}$.

In decision block 550, the difference between device A self-resonant frequency fA and device B estimated self-resonant frequency fB is calculated and compared to a threshold. In exemplary heuristic 500 the logical comparison is whether the difference is "greater than" a threshold. Other heuristics may use alternative logical comparisons, such as "equal to", "less than", "greater than or equal to", or "less than or equal to".

The first time that the decision of block 550 is made during the execution of heuristic 500, self-resonant frequency fA may be the frequency saved as fA in optional block 520. However, fA may alternatively be, for example, the self-resonant frequency of device A as designed.

If at decision block 550 the result is "NO", heuristic 500 ends. If, however, the result is "YES", heuristic 500 continues at block 555.

In block 555, capacitance C_A of device A is calculated such that the self-resonant frequency of device A is equal to the estimated self-resonant frequency fB_est of device B. For example, knowing the inductance L_A of the device A coil and setting the self-resonant frequency of device A to fA=fB_est, the value of C_A may be determined from equation 1, as illustrated in equation 10.

$$2\pi * fB\_est = \frac{1}{\sqrt{L\_A * C}} \qquad (10)$$

At block 560, the capacitor of the device A resonant circuit is adjusted to the value of C_A calculated in block 555. Heuristic 500 continues at block 530 with the adjusted capacitor.

Heuristic 500 continues iteratively until the difference calculated at block 550 is within an acceptable limit, for example is less than or equal to a threshold, at which point heuristic 500 ends.

A frequency sweep may be performed in digital or analog form. In digital form, the source, as described above with respect to block 510 for example, is stepped from a starting frequency to an ending frequency in discrete steps. In analog form, the frequency may be increased from a starting frequency to an ending frequency continuously. Further, the starting frequency may be greater than or less than the ending frequency, such that there is a sweep down or a sweep up, respectively.

Thus, heuristic 500, and other heuristics described herein, may be implemented in digital circuitry, analog circuitry, or mixed analog and digital circuitry.

Figure 6:
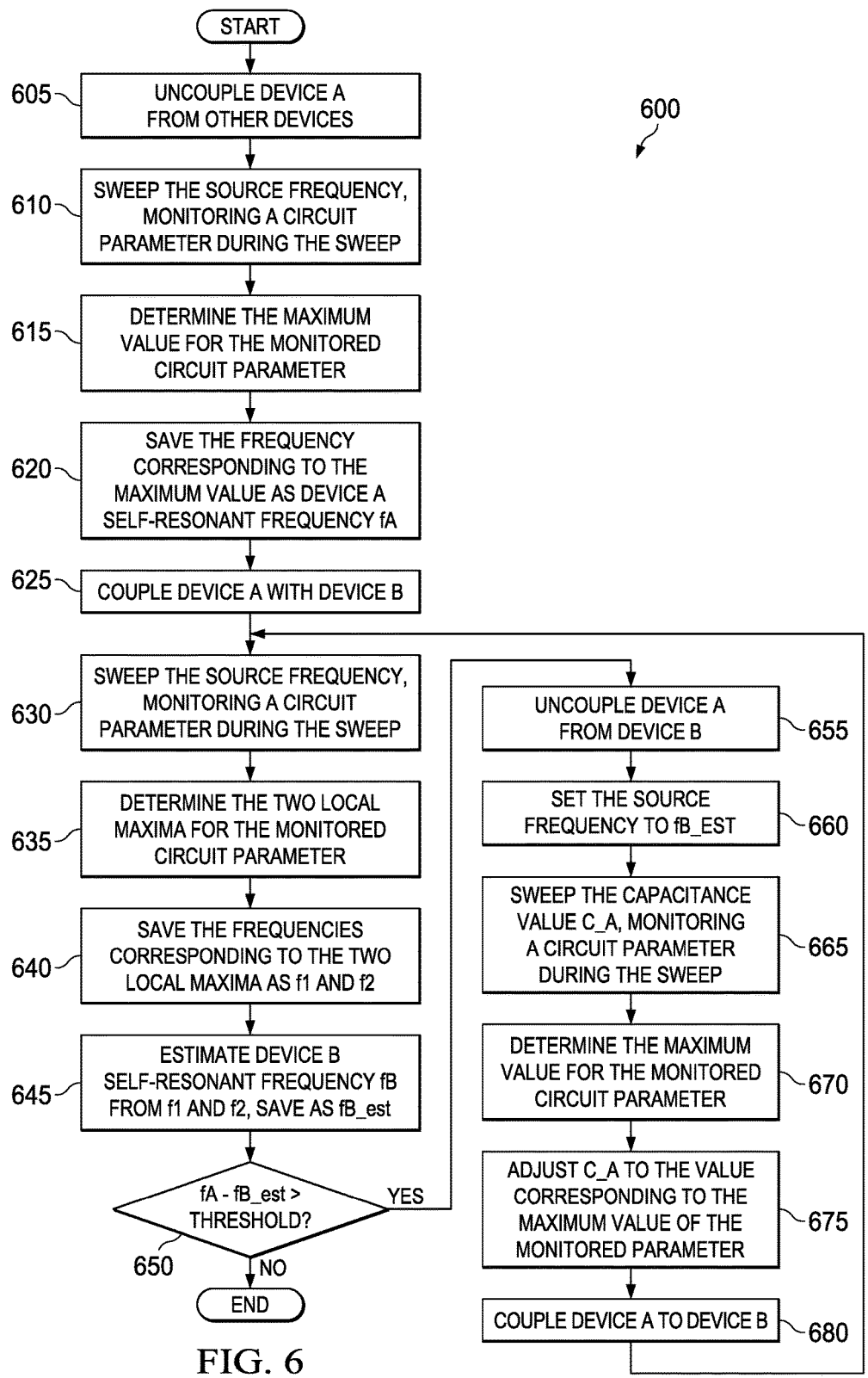
FIG. 6 illustrates another exemplary heuristic for tuning a device to achieve improved power transfer.

FIG. 6 illustrates a second exemplary heuristic for tuning a device A to achieve improved power transfer between the device A and a device B.

Heuristic 600 in FIG. 6 starts with optional blocks 605-620 in which the self-resonant frequency fA of device A is determined. In block 605, device A is uncoupled from all other devices. Uncoupling in this context refers to physically removing or otherwise isolating device A from the influence of any other device that could electromagnetically couple to the power transfer coil of device A.

In block 610, the source frequency of device A is swept and a circuit parameter monitored, wherein the frequency of the source is stepped from a starting frequency to an ending frequency in discrete steps and at each frequency step the value of a circuit parameter is measured. For example, the input current may be measured at each frequency step. Other circuit parameters that could be monitored include but are not limited to voltage across the coil of device A, or power delivered by the source.

In block 615, the data from the monitored circuit parameter is analyzed to determine a maximum value for the parameter.

In block 620, the frequency corresponding to the maximum value of the monitored circuit parameter is saved as the self-resonant frequency fA of device A.

In block 625, tuning of device A to device B begins by coupling device A and device B. Coupling in this context refers to physically placing device B in the vicinity of device A, or removing an isolation mechanism from device A. Coupling requires both device A and device B to be powered and the corresponding resonant circuits to be active.

In block 630, the source frequency of device A is swept and a circuit parameter monitored, wherein the frequency of the source is stepped from a starting frequency to an ending frequency in discrete steps and at each frequency step the value of a circuit parameter is measured. The frequency steps of block 630 are not necessarily the same frequency steps and do not necessarily have the same frequency delta between the steps as do the steps of block 610. The monitored circuit parameter may be the same as the parameter monitored in block 615 but may alternatively be a different parameter or set of parameters. Circuit parameters that could be monitored include but are not limited to source current of device A, voltage across the coil of device A, power delivered by the source of device A, efficiency of power delivery, voltage across the coil of device B, coil current of device B, output voltage of device B, and output power of device B.

In block 635, the data from the monitored circuit parameter is analyzed to determine the two local maxima for the monitored parameter corresponding to the two resonant modes of the coupled devices.

In block 640, the two frequencies corresponding to the two local maxima of the circuit parameter are saved as frequencies f1 and f2.

In block 645, the self-resonant frequency fB of device B is estimated from frequencies f1 and f2 and saved as fB_est. There are many ways of estimating fB from f1 and f2, including using equation 9.

$$fB\_est = m*f1 + n*f2 \quad (9)$$

In a simple instance of an estimation using equation 9, variables m and n are set to m=n=½.

In decision block 650, the difference between device A self-resonant frequency fA and device B estimated self-resonant frequency fB is calculated and compared to a threshold. In exemplary heuristic 60 the logical comparison is whether the difference is "greater than" a threshold. Other heuristics may use alternative logical comparisons, such as "equal to", "less than", "greater than or equal to", or "less than or equal to".

The first time that the decision of block 650 is made during the execution of heuristic 600, self-resonant frequency fA may be the frequency saved as fA in optional block 620. However, fA may alternatively be, for example, the self-resonant frequency of device A as designed.

If at decision block 650 the result is "NO", heuristic 600 ends. If, however, the result is "YES", heuristic 600 continues at block 655.

In block 655, device A is uncoupled from device B.

In block 660, the source frequency of device A is set to the estimated frequency fB_est of block 645.

In block 665, the capacitance value C_A of the resonant circuit of device A is swept, meaning that the capacitance value C_A is stepped from one value to another value in a sequence, and at each value a circuit parameter value is measured.

In block 670, the maximum value of C_A is determined from the measurements in block 665.

In block 675, the capacitor of the device A resonant circuit is adjusted to the value of C_A determined in block 670.

In block 680, device A is coupled to device B, and heuristic 500 continues at block 630 with the adjusted capacitor.

Heuristic 600 continues iteratively until the difference calculated at block 650 is within an acceptable limit, for example is less than or equal to a threshold, at which point heuristic 600 ends.

The heuristics described in alternative heuristics 500 and 600 have been shown to converge within ten iterations or less. An exemplary test run is shown in Table 2 for a coupling coefficient of k=0.02 in which convergence occurs in just eight iterations through heuristic 500.

TABLE 2

| Trial | fA | fB | k | f1 | f2 |
|---|---|---|---|---|---|
| 1 | 3.30E+05 | 2.91E+05 | 0.02 | 3.30E+05 | 2.91E+05 |
| 2 | 3.10E+05 | 2.91E+05 | 0.02 | 3.11E+05 | 2.90E+05 |
| 3 | 3.01E+05 | 2.91E+05 | 0.02 | 3.02E+05 | 2.90E+05 |
| 4 | 2.96E+05 | 2.91E+05 | 0.02 | 2.97E+05 | 2.90E+05 |
| 5 | 2.93E+05 | 2.91E+05 | 0.02 | 2.95E+05 | 2.89E+05 |
| 6 | 2.92E+05 | 2.91E+05 | 0.02 | 2.95E+05 | 2.89E+05 |
| 7 | 2.92E+05 | 2.91E+05 | 0.02 | 2.94E+05 | 2.88E+05 |
| 8 | 2.91E+05 | 2.91E+05 | 0.02 | 2.94E+05 | 2.88E+05 |
| 9 | 2.91E+05 | 2.91E+05 | 0.02 | 2.94E+05 | 2.88E+05 |
| 10 | 2.91E+05 | 2.91E+05 | 0.02 | 2.94E+05 | 2.88E+05 |

Heuristics 500 and 600 illustrated the adjustment of device A capacitor value C_A to tune device A. Additionally or alternatively, other circuit elements may be adjusted for tuning. For example, one or more of the device A coil, device B coil, device B capacitor may be additionally or alternatively adjusted.

For a given value of coupling coefficient k, the frequency sweep of block 510 or block 610 should be performed in steps of less than $f\_step = k*\omega 0/2$.

As mentioned, heuristics 500 and 600 are reiterative heuristics. It may instead be desirable to complete tuning in a single pass, for example, to reduce tuning time.

Figure 7:
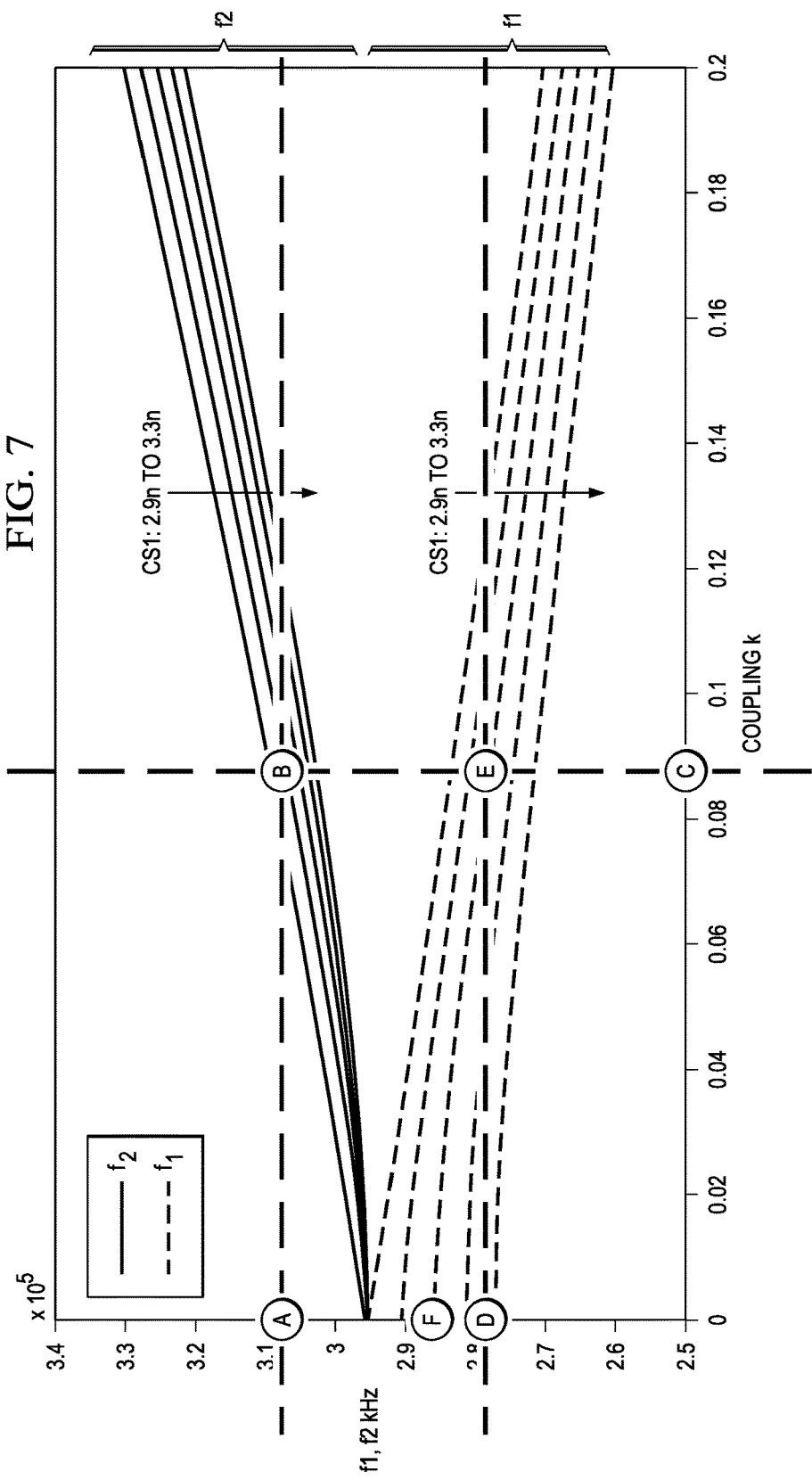
FIG. 7 illustrates a representative set of steps for a single-pass tuning heuristic.

FIG. 7 is a copy of the graph of FIG. 4 with various points on the graph highlighted. FIG. 7 is used for reference in the discussion of FIG. 8. For the purposes of the discussion of FIG. 8, the graph may be the result of either simulation or measurement, and may be stored as, for example, as a set of equations or as a look-up table.

Figure 8:
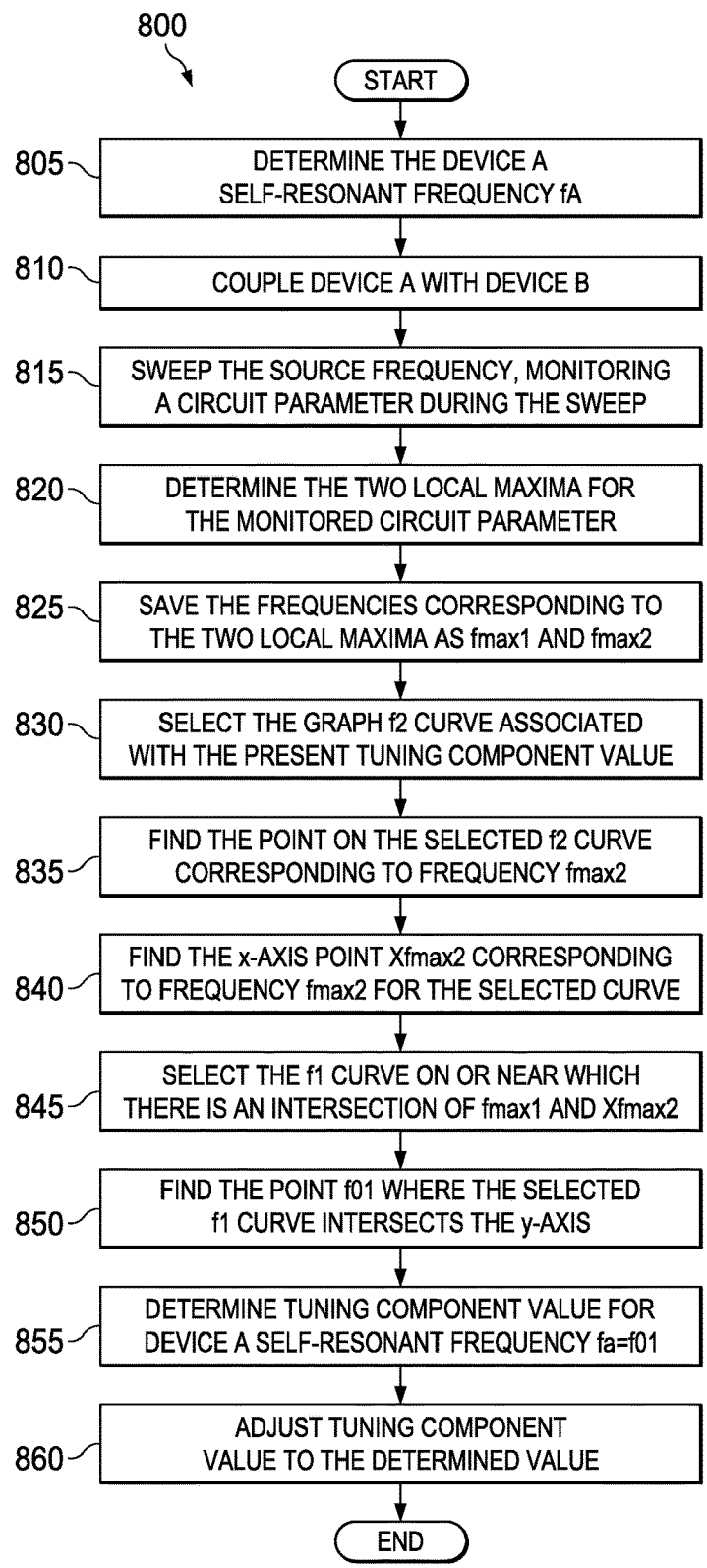
FIG. 8 illustrates another exemplary heuristic for tuning a device to achieve improved power transfer.

FIG. 8 illustrates an exemplary single-pass heuristic 800 for tuning a device A to achieve improved power transfer between the device A and a device B.

In block 805, the self-resonant frequency fA of device A is determined, for example, as described above.

In block 810, device A is coupled to device B, as described above.

In block 815, the source frequency of device A is swept and a circuit parameter monitored, as described above.

In block 820, the data from the monitored circuit parameter is analyzed to determine the two local maxima for the monitored parameter corresponding to the two resonant modes of the coupled devices.

In block 825, the two frequencies corresponding to the two local maxima of the circuit parameter are saved as frequencies fmax1 and fmax2.

In block 830, referring to the graph in FIG. 7, the f2 curve related the present value of the device A tuning component is selected. The present value of the tuning component is, for example, retrieved from a register or other memory location. In FIG. 7, the tuning component is a capacitor, thus curves are shown for various capacitance values.

In block 835, the point on the selected f2 curve corresponding to frequency fmax2 is determined. For example, in FIG. 7, fmax2 is identified by the circle labeled A. A line is drawn through circle A perpendicular to the y-axis. The point where the line intersects the selected f2 curve is identified, as indicated by the circle labeled B in FIG. 7.

In block 840, the x-axis point corresponding to the frequency fmax2 for the selected curve is determined. For example, in FIG. 7, a line is drawn through the point within circle B perpendicular to the x-axis. The coupling coefficient Xfmax2 at the intersection of the line and the x-axis is determined, as indicated by the circle labeled C in FIG. 7.

In block 845, an f1 curve, on or near which there is an intersection of Xfmax2 and fmax1, is selected. For example, on FIG. 7, fmax1 is found on the y-axis, as indicated by circle D. A line is drawn through circle D perpendicular to the y-axis. An f1 curve on or near the intersection of the lines through circles C and D is selected. In FIG. 7, the intersection of the lines is on or near the third f1 curve, as indicated by circle E.

In block 850, the point f01 where the selected f1 curve intersects the y-axis is determined. For example, in FIG. 7, the selected third f1 curve is traced back from circle E to where the curve intersects the y-axis, as indicated by circle F. The intersection of the selected curve with the y-axis is frequency f01.

In block 855, a value for the device A tuning component is determined such that the device A resonant frequency fA is equal to the frequency f01 determined in block 850. For example, the device A tuning component value may be calculated using fA=f01. For another example, device A may be uncoupled from device B and the tuning component value may be swept to find the value at which fA=f01.

In block 860, the tuning component is adjusted to the value determined in block 855.

Following block 860, heuristic 800 ends.

FIG. 8 illustrates an exemplary single-pass heuristic. However, one or more blocks of the heuristic may be repeated as desired. For example, an additional sweep may be incorporated to minimize the difference between the magnitude of the maxima at f1 and f2.

Thus is described three exemplary heuristics that may be used to tune a wireless power transfer device such that, when the device is coupled with another device, the frequency difference between the two resonant modes of a system containing the coupled devices is minimized.

The exemplary heuristics described herein may be performed by a processor executing instructions from a memory on the wireless power transfer device. One or more heuristics may be included as instructions in the memory. If more than one heuristic is included as instructions in the memory, a heuristic may be selected for a given set of conditions. As just one example, the heuristic of FIG. 5 may be used during production of the wireless power transfer device for initializing the device and the heuristic of FIG. 8 may be used prior to or during power transfer in a user environment.

In a production environment, a test setup using a representative coupled device may be used. If the transmitter and receiver of a wireless power transfer system are to be packaged together, a heuristic such as one of the exemplary heuristics described above may be used to tune the system.

CONCLUSION

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be apparent upon reading the above description. The scope of the invention should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A wireless power transfer device, comprising:
   power transfer terminals for coupling to a power transfer resonator external to the device, the resonator including:
   a resonator power transfer coil, and
   a resonator tuning capacitor with an adjustable tuning capacitance C_A,
   the power transfer resonator having a self-resonant frequency controllable based on adjusting C_A;
   a variable converter circuit to generate a variable alternating current voltage Vac and adjustable tuning signals to adjust adjustable tuning capacitance C_A, output through the power transfer terminals, corresponding to the controllable self-resonant frequency of the power transfer resonator;
   the variable converter circuit operable, when the power transfer device is magnetically coupled through the power transfer resonator to a power receiver device with a power receiver resonator, to:
   output through the power transfer terminals an initial Vac corresponding to an initial self-resonant frequency fA for the power transfer resonator, based on an initial capacitance value C_A for the adjustable tuning capacitor;
   iteratively adjust Vac to control the self-resonant frequency fA for the power transfer resonator, including iteratively adjusting capacitance C_A for the resonator tuning capacitor, based on iteratively estimating a self-resonant frequency fB of the power receiver device, by:
   sweeping the frequency of Vac in discrete frequency steps, and in each frequency step, monitoring a circuit parameter of the variable converter circuit, identifying a first local maximum and a second local maximum for the values of the circuit parameter corresponding to two resonant modes of the power transfer resonator and the power receiver resonator, ascertaining a first frequency and a second frequency corresponding to the first and second local maxima, respectively, and estimating a self-resonant frequency fB_est of the power receiver device based on the first and second frequencies;

the variable converter circuit operable, when (fA−fB_est) is different than a threshold value, to:

adjust the tuning capacitance C_A so that fA is substantially equal to fB_est; and iteratively perform a next estimation for a next estimated self-resonant frequency fB_est.

2. The device of claim 1, wherein, if (fA−fB_est) is not different than the threshold, the variable converter circuit is operable to transfer power between power transfer device and the power receiver device.

3. The device of claim 1, the circuit parameter being a current provided by the variable converter circuit.

4. The device of claim 1, the circuit parameter being a voltage across the power transfer terminals.

5. The device of claim 1, the circuit parameter being voltage across the power transfer coil.

6. The device of claim 1, wherein estimating the self-resonant frequency fB of the wireless power receiver device is based on fB=m*f1+n*f2, wherein fB_est is the estimated self-resonant frequency of the power receiver device, f1 is the first frequency, f2 is the second frequency, and m and n are variables.

7. The device of claim 1, wherein adjusting the tuning capacitance C_A so that fA is substantially equal to fB_est is accomplished by calculating a value of the tuning capacitance C_A such that the power transfer device is self-resonant at fA=fB_est, and adjusting C_A to the calculated value.

8. The device of claim 1, wherein adjusting the tuning capacitance C_A so that fA is substantially equal to fB_est is accomplished by:

determining a value of the tuning capacitance C_A by:
uncoupling the power transfer device from the power receiver device;
setting the frequency of the AC power source to fB_est;
sweeping the frequency of the AC power source in discrete steps, and, for each discrete frequency step, monitoring a circuit parameter; and
determining a maximum value for the monitored parameter;

adjusting C_A to the value corresponding to the maximum value of the monitored parameter; and coupling the power transfer device to the power receiver device.

9. The device of claim 1, wherein establishing an initial self-resonant frequency fA for the power transfer device based on an initial capacitance value C_A for the adjustable tuning capacitor comprises:

uncoupling the power transfer device from the power receiver device;

sweeping the frequency of the AC power source in discrete frequency steps, and for each discrete frequency step, monitoring a circuit parameter;

determining a maximum value for the monitored parameter; and establishing an initial self-resonant frequency fA for the power transfer device as a frequency corresponding to the maximum value for the monitored parameter.

10. The device of claim 1, wherein the power transfer resonator is a series resonator with a resonator capacitor in series with a resonator power transfer coil coupled between the power transfer terminals.

* * * * *